(12) United States Patent
Ma et al.

(10) Patent No.: US 12,130,336 B2
(45) Date of Patent: *Oct. 29, 2024

(54) BATTERY DEVICE, DETECTION METHOD THEREOF, AND SCREENING METHOD AND DEVICE OF BATTERY UNIT

(71) Applicant: CALB Co., Ltd., Jiangsu (CN)

(72) Inventors: Ruijun Ma, Changzhou (CN); Shihui Zhang, Changzhou (CN); Zhipeng Liu, Changzhou (CN); Qiru Li, Changzhou (CN)

(73) Assignee: CALB Co., Ltd., Jiangsu (CN)

( * ) Notice: Subject to any disclaimer, the term of this patent is extended or adjusted under 35 U.S.C. 154(b) by 286 days.

This patent is subject to a terminal disclaimer.

(21) Appl. No.: 17/855,766

(22) Filed: Jun. 30, 2022

(65) Prior Publication Data
US 2023/0366948 A1 Nov. 16, 2023

(30) Foreign Application Priority Data
May 12, 2022 (CN) .......................... 202210513952.8

(51) Int. Cl.
*G01R 31/396* (2019.01)
*G01R 31/385* (2019.01)
(Continued)

(52) U.S. Cl.
CPC .......... *G01R 31/396* (2019.01); *G01R 31/385* (2019.01); *H01M 10/441* (2013.01); *H01M 10/482* (2013.01); *H01M 50/119* (2021.01)

(58) Field of Classification Search
CPC . G01R 31/396; G01R 31/385; H01M 50/119; H01M 10/441; H01M 10/482
(Continued)

(56) References Cited

U.S. PATENT DOCUMENTS

| 2015/0084595 | A1* | 3/2015 | Gleiter | .................. | H02J 7/0049 |
| | | | | | 320/162 |
| 2017/0366023 | A1* | 12/2017 | Tanaka | .................. | H01M 10/425 |

(Continued)

FOREIGN PATENT DOCUMENTS

| CN | 103611692 | 3/2014 |
| CN | 105738830 | 7/2016 |

(Continued)

OTHER PUBLICATIONS

"Office Action of China Counterpart Application", issued on Jul. 5, 2022, with partial English translation thereof, p. 1-p. 9.

(Continued)

*Primary Examiner* — Alexander Satanovsky
*Assistant Examiner* — Trung Q Nguyen
(74) *Attorney, Agent, or Firm* — JCIP GLOBAL INC.

(57) ABSTRACT

The invention discloses a battery device, a detection method thereof, and a screening method and device of a battery unit. A difference between characteristic values of any two battery units in the target charge state within a first preset range is controlled. Through the difference in overpotential of different battery units, the polarization difference between different battery units is reflected, thus reflecting the consistency difference between different battery units. The solution may dynamically monitor the consistency of various battery units, which may reflect the consistency of the battery unit during use, realize the online monitoring of the battery unit, and provide guidance for use of the battery device in subsequent process.

19 Claims, 7 Drawing Sheets

(51) Int. Cl.
  *H01M 10/44*   (2006.01)
  *H01M 10/48*   (2006.01)
  *H01M 50/119*  (2021.01)

(58) Field of Classification Search
  USPC .............. 324/500, 600, 76.11, 551, 425–434
  See application file for complete search history.

(56) References Cited

U.S. PATENT DOCUMENTS

| | | | |
|---|---|---|---|
| 2018/0312074 A1* | 11/2018 | Tsutsumi | .............. B60L 3/0046 |
| 2019/0214833 A1* | 7/2019 | Li | ....................... H02J 7/00718 |
| 2021/0190868 A1 | 6/2021 | Benoit | |
| 2022/0299577 A1* | 9/2022 | Konishi | ................ G01R 31/367 |
| 2023/0266393 A1* | 8/2023 | Lim | ...................... H01M 10/48 |
| | | | 324/433 |

FOREIGN PATENT DOCUMENTS

| | | |
|---|---|---|
| CN | 110813799 | 2/2020 |
| CN | 112354897 | 2/2021 |
| CN | 112083336 | 2/2022 |

OTHER PUBLICATIONS

"Search Report of Europe Counterpart Application", issued on Jan. 4, 2023, p. 1-p. 7.

* cited by examiner

BATTERY DEVICE, DETECTION METHOD THEREOF, AND SCREENING METHOD AND DEVICE OF BATTERY UNIT

CROSS-REFERENCE TO RELATED APPLICATION

This application claims the priority benefit of China application serial no. 202210513952.8, filed on May 12, 2022. The entirety of the above-mentioned patent application is hereby incorporated by reference herein and made a part of this specification.

BACKGROUND

Technical Field

The present disclosure relates to the field of battery technology, in particular to a battery device, a detection method thereof, and a screening method and device of a battery unit.

Description of Related Art

During the preparation process of single batteries, due to the differences between batches of materials and limitations of battery manufacturing processing such as pulping, coating, and rolling, even if the single batteries are manufactured in the same batch, there will inevitably be differences in consistency between single batteries caused by the manufacturing process, resulting in differences between the single batteries obtained. If the single batteries are directly grouped, it will lead to differences between battery groups, such that the consistency between the single batteries in the battery group is poor. Therefore, before the batteries are grouped, the batteries are screened for consistency to select single batteries with good consistency for grouping.

In the prior art, the single batteries with good consistency of indicators such as battery voltage, internal resistance, and capacity are usually selected for grouping. However, after the single batteries are just manufactured, and the single batteries with good consistency are screened out through indicators such as battery voltage, internal resistance, and capacity, and are assembled into battery groups, there is usually a period of storage and shelving before the batteries are loaded onto vehicles. The storage process usually ranges from a few months to a year. During the storage process, a series of electrochemical changes spontaneously occur inside the single batteries, causing the consistency between the single batteries to worsen again.

Therefore, providing a battery group which can still have good consistency between single batteries after a period of storage and shelving is a technical issue to be solved urgently by persons skilled in the art.

SUMMARY

Embodiments of the present disclosure provide a battery device, a detection method thereof, and a screening method and device of a battery unit.

In the first aspect, an embodiment of the present disclosure provides a battery device, including at least two battery units, and a relative difference between characteristic values of any two of the battery units under a target charge state is within a first preset range.

The first preset range is 0.5% to 10%, and the relative difference is: the ratio of a difference between two of the characteristic values to a larger value of two of the characteristic values.

The characteristic values are obtained through testing as follows.

Any one of the battery units at 3.6 Volt (V) is discharged at a discharge rate of 6 Capacity (C) for 40 second(s), and a variation curve between the differential result of overpotential and time and time is obtained, and a target point corresponding to the differential result with a value of 0.02 is selected from the variation curve. When the target point includes two target points, the characteristic values are determined according to the maximum value of the time corresponding to each of the two target points.

In the second aspect, an embodiment of the present disclosure provides a screening method of battery units, including the following.

For a plurality of battery units to be selected, the characteristic value of each of the battery units in the target charge state is determined. The characteristic value is determined according to an overpotential obtained by discharging each of the battery units according to the target discharge rate corresponding to the target charge state in the target charge state.

The difference between any two of the characteristic values is calculated;

The battery units with the difference between any two of the characteristic values falling within the first preset range are selected and grouped.

In the third aspect, an embodiment of the present disclosure provides a detection method of a battery device, including the following.

When the battery device includes a plurality of battery units, a characteristic value of each of the battery units in the current charge state is determined. The characteristic value is determined according to an overpotential obtained by discharging each of the battery units according to the discharge rate corresponding to the current charge state in the current charge state.

The difference between any two of the characteristic values is calculated;

The consistency of the battery device is determined based on the difference between any two of the characteristic values.

In the fourth aspect, an embodiment of the present disclosure provides a screening device for battery units, including the following.

A memory is configured for storing program instructions.

A processor is configured to invoke the program instruction stored in the memory, and execute the above-mentioned screening method provided by the embodiment of the present disclosure according to the obtained program.

In the fifth aspect, an embodiment of the present disclosure provides a detection device for a battery device, including the following.

A memory is configured for storing program instructions.

A processor is configured to invoke the program instruction stored in the memory, and execute the above-mentioned detection method provided by the embodiment of the present disclosure according to the obtained program.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

Figure 1:
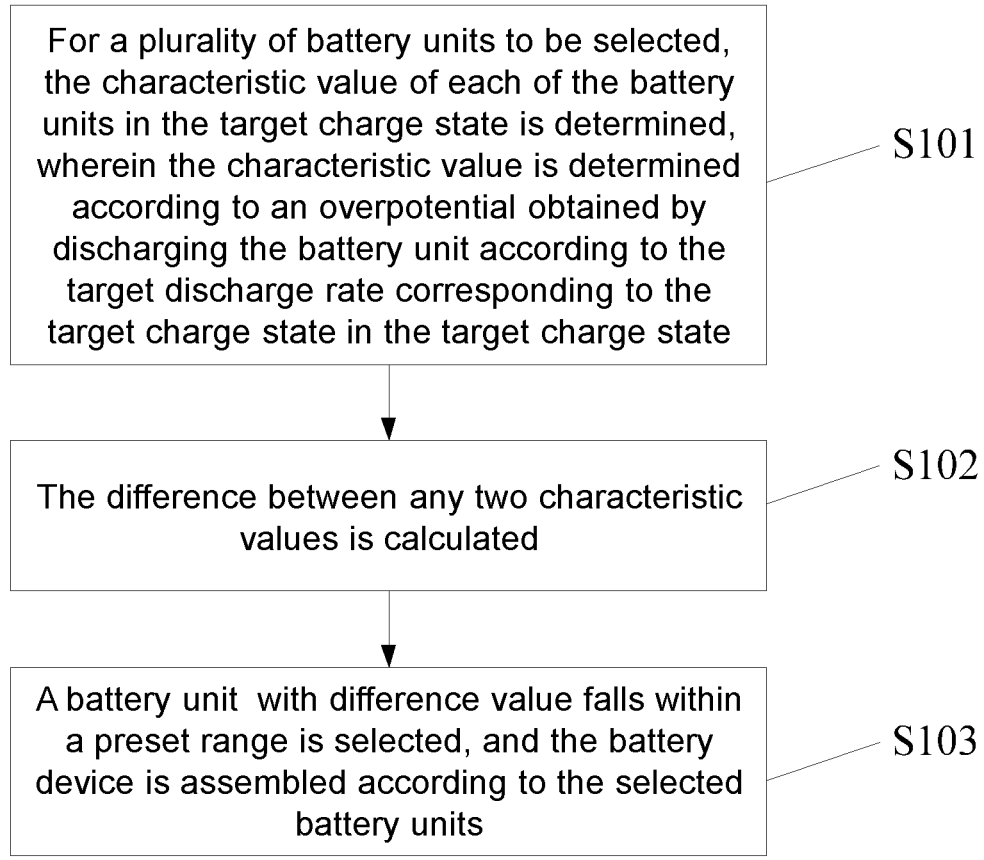
FIG. 1 is a flowchart of a screening method of battery units provided in an embodiment of the present disclosure.

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

In particular, a reference to "the" object or "a" and "an" object is intended to denote also one of a possible plurality of such objects. Unless otherwise defined or described, the terms "connect", "fix" should be broadly interpreted, for example, the term "connect" can be "fixedly connect", "detachably connect", "integrally connect", "electrically connect" or "signal connect". The term "connect" also can be "directly connect" or "indirectly connect via a medium". For the persons skilled in the art, the specific meanings of the abovementioned terms in the present disclosure can be understood according to the specific situation.

Further, in the description of the present disclosure, it should be understood that spatially relative terms, such as "above", "below" "inside", "outside" and the like, are described based on orientations illustrated in the figures, but are not intended to limit the exemplary embodiments of the present disclosure.

In the context, it should also be understood that when an element or features is provided "outside" or "inside" of another element(s), it can be directly provided "outside" or "inside" of the other element, or be indirectly provided "outside" or "inside" of the another element(s) by an intermediate element.

The specific implementations of the battery device, the detection method thereof, the method and screening device for battery units provided by the embodiments of the present disclosure will be described in detail below with reference to the accompanying drawings. It should be noted that the described embodiments are only a part of the embodiments of the present disclosure, but not all of the embodiments. Based on the embodiments of the present disclosure, all other embodiments obtained by those of ordinary skill in the art without creative efforts shall fall within the protection scope of the present disclosure.

An embodiment of the present disclosure provides a battery device, including at least two battery units, and a relative difference between characteristic values of any two of the battery units under a target charge state is within a first preset range.

The first preset range is 0.5% to 10%, and the relative difference is a ratio of a difference between two of the characteristic values to a larger value two of the characteristic values.

The characteristic values are obtained through testing as follows.

The battery unit at 3.6 Volt (V) is discharged at a discharge rate of 6 Capacity (C) for 40 second(s), and a variation curve between the differential result of overpotential and time and time is obtained, and a target point corresponding to the differential result with a value of 0.02 is selected from the variation curve. When there are two target points, the characteristic value is determined according to the maximum value of the time corresponding to each of these two target points.

The number of battery units included in the battery device may be set according to actual needs, which is not limited in the disclosure.

The specific target charge state may be set according to actual needs, which is not limited in the disclosure, but the characteristic values of different battery units need to be the characteristic values in the same charge state.

In this way, by controlling the relative difference of the characteristic values of any two battery units in the target charge state within the first preset range, the battery units may have better consistency. Moreover, the battery groups screened in this way still have good consistency after being stored and shelved for a period of time, so that the consistency between battery units undergoing a period of storage will not deteriorate. As such, the battery device may have better performance.

Furthermore, the characteristic value is determined according to the target point corresponding to the differential result with a value of 0.02 in the variation curve between the differential result of overpotential and time and time. As such, the characteristic value reflects polarization (including concentration polarization, electrochemical polarization, and ohmic polarization, etc.) of the battery unit during the discharge process. That is, through the difference in overpotential of different battery units, the polarization difference between different battery units is reflected, thus reflecting the consistency difference between different battery units.

To be clear, the discharge rate 6C means the following.

C in the discharge rate represents the discharge current of the battery unit, and 6C in the discharge rate refers to 6 times the capacity of the battery unit. If the capacity of the battery unit is 2.5 Ah, 6C is 15 A.

Therefore, using a discharge rate of 6C for discharging means using a discharge current of 15 A for discharging.

In some embodiments, the capacity of the battery unit may be obtained, but not limited to, in the following ways.

Under an environment of 25° C. the battery unit is kept static for 4 hours, and after the temperature of the battery unit is stable, the following process is performed.

Step 1: A discharge current of 5 A is adopted to discharge the battery unit with constant current, and the battery unit is discharged to 2.8V.

Step 2: The battery unit is kept static for 5 minutes.

Step 3: A charge current of 5 A is adopted, and the battery unit is charged to 4.2V with a constant current, and then charged with a constant voltage until the current is less than or equal to 1 A.

Step 4: The battery unit is kept static for 5 minutes.

Step 5: A discharge current of 5 A is adopted to discharge the battery unit with constant current, and the battery unit is discharged to 2.8V.

Step 6: The discharge capacity is recorded when Step 5 is completed, and the discharge capacity is used as the capacity of the battery unit.

Alternatively, in some embodiments, other methods for determining the battery capacity may also be adopted, the disclosure is not limited to the above-mentioned process.

Alternatively, in some embodiments, if the capacity of the battery unit can be directly obtained through the parameters of the battery unit, it may not be necessary to adopt the above process for determining.

In some embodiments, the first preset range may further be set to 2% to 5%.

Further, when the relative difference between the characteristic values of any two battery units in the target charge state is in a range of 2% and 4%, it is possible to make the difference between the characteristic values of any two battery units in the target charge state to be smaller, so that each battery unit may have better consistency.

In some embodiments, in addition to the relative difference value, the absolute difference value may also be adopted. Under circumstances, the first preset range may be set according to the difference between the characteristic values of normal battery units (or known battery units with good consistency) under the target charge state, and the disclosure is not limited thereto.

In some embodiments, the characteristic value of any battery unit under the target charge state is within a second preset range.

The second preset range is 27 s to 36 s.

In this way, on the basis that the relative difference based on the characteristic value is within the first preset range, and the characteristic value is further limited within the second preset range, which not only may make the battery units have better consistency, but also ensure that each battery unit has excellent performance, so that the performance of the battery device may be further improved.

In some embodiments, the material for manufacturing the casing of the battery unit includes non-metal, and the second preset range is 27 s to 33 s.

Or, the material for manufacturing the casing of the battery unit includes metal, and the second preset range is 27 s to 36 s.

The battery units of non-metal casing may include, but are not limited to, soft-packed batteries, and the battery units of metal casing may include, but are not limited to, square casing batteries.

That is to say, the second preset range corresponding to the battery units of non-metal casing may further be set to 27 s to 33 s, and the second preset range corresponding to the battery units of metal casing may further be set to 27 s to 36 s.

In this way, different second preset ranges may be given based on different types of battery units, so as to match the types of battery units, which may further allow each battery unit to have better consistency, and further ensure that each battery unit has excellent performance, so as to improve the performance of the battery device as much as possible.

In some embodiments, the process of determining the variation curve between the differential result of overpotential and time and time may include the following.

After the discharge rate 6C is adopted for discharging for 40 s, the voltage data and time data may be obtained.

The overpotential may be obtained by subtracting the voltage at each moment from the voltage at the initial discharge moment (i.e., 3.6V).

The differential result of overpotential and time is calculated.

The correspondence relationship between the differential result and time is established, and the variation curve is obtained.

Based on the same inventive concept, an embodiment of the present disclosure provides a screening method of battery units, as shown in FIG. 1, including the following.

S101. For a plurality of battery units to be selected, the characteristic value of each of the battery units in the target charge state is determined. The characteristic value is determined according to an overpotential obtained by discharging the battery unit according to the target discharge rate corresponding to the target charge state in the target charge state.

In some embodiments, the target discharge rate is in a one-to-one correspondence with the target charge state, and has no relevance with any specific battery unit.

S102. The difference between any two characteristic values is calculated.

S103. A battery unit with difference value between any two characteristic values falls within a first preset range is selected.

The selected battery units may be used to assemble the battery device.

Moreover, the first preset range mentioned in step S103 may be set according to actual needs, which is not limited in the disclosure.

In this way, by controlling the difference between the characteristic values of any two battery units in the target charge state to be within the first preset range, it is possible to make the battery units have better consistency, so that the battery device may have better performance.

Moreover, the characteristic value is determined according to the overpotential obtained when the battery unit is discharged at the target charge state according to the target discharge rate. As such, the characteristic value reflects polarization (including concentration polarization, electrochemical polarization, and ohmic polarization, etc.) of the battery unit during the discharge process. That is, through the difference in overpotential of different battery units, the polarization difference between different battery units is reflected, thus reflecting the consistency difference between different battery units. In this way, when the battery units are screened based on the characteristic value, the screened battery units may have better consistency.

In some embodiments, the step of determining the characteristic value according to the overpotential specifically includes the following.

When the battery unit in the target charge state is discharged according to the target discharge rate, the variation curve between the differential result of overpotential and time and time is obtained.

According to the preset selection requirements, a target point is selected from the variation curve, and the characteristic value is determined according to the target point.

In this way, the variation curve between the differential result of overpotential and time and time may be determined based on the overpotential obtained by discharging the battery unit, and the target point may be selected from the variation curve to determine the characteristic value, so that the characteristic value may be determined according to the variation of the overpotential.

Of course, in some embodiments, when determining the characteristic value according to the overpotential, the characteristic value not only may be determined specifically according to the variation curve between the differential result of overpotential and time and the time, but also may be determined according to other data related to the overpotential as long as the characteristic value in the target charge state can be determined.

For example, other data related to overpotential may specifically include: feature parameters of polarization internal resistance.

That is to say, in specific implementation, the method for determining the characteristic value may be selected according to the actual needs, so as to meet the needs of different application scenarios and improve the flexibility of design.

In some embodiments, according to the preset selection requirements, the step of selecting the target point from the variation curve and determining the characteristic value according to the target point specifically includes the following.

The point corresponding to the preset differential result in the variation curve is determined as the target point.

When there is one target point, the time corresponding to such one target point is adopted as the characteristic value; or, when there are multiple target points, the maximum value of time corresponding to each of these target points is adopted as the characteristic value.

Figure 2:
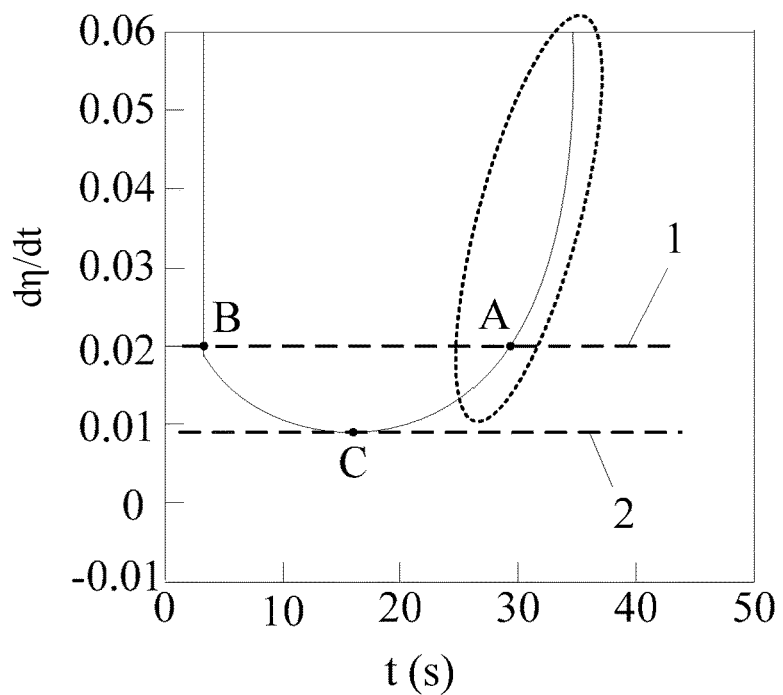
FIG. 2 is a schematic view of a variation curve provided in an embodiment of the present disclosure.

For example, with reference to the schematic view of the variation curve shown in FIG. 2, $d\eta/dt$ represents the differential result of overpotential and time, $\eta$ represents overpotential, and $t$ represents time. When the preset differential result is set to 0.02, it may be shown in the figure that the vertical coordinate is constantly a dashed line 1 indicating 0.02. There are two intersection points between the dashed line 1 and the variation curve. Under the circumstances, these two intersection points may be determined as target points (respectively denoted as target point A and target point B).

Moreover, the time corresponding to the target point A (that is, the horizontal coordinate of the target point A) is greater than the time corresponding to the target point B (that is, the horizontal coordinate of the target point B), so the time corresponding to the target point A may be adopted as the characteristic value.

Alternatively, when the preset differential result is set to 0.009, it may be shown in the figure that the vertical coordinate is constantly a dashed line 2 indicating 0.009. There is one intersection point between the dashed line 2 and the variation curve. Under the circumstances, this intersection point may be determined as the target point (denoted as the target point C); and, the time corresponding to the target point C (that is, the horizontal coordinate of the target point C) is adopted as the characteristic value.

It should be noted that when setting the preset differential result, the preset differential result may be set according to actual needs but cannot be set beyond a range for the following reason.

As shown in FIG. 2, the variation curve changes abruptly and rises at the end (as shown in the circle illustrated in dotted line), indicating that with the increase of time, the overpotential changes considerably and increases rapidly. If the preset differential result is set to be a large value, the vertical coordinate of the selected target point will be larger, and the corresponding overpotential will also be larger (take FIG. 2 as an example, the value of the vertical coordinate is positively correlated with the overpotential). The excessive overpotential will lead to an increase in the polarization of the battery unit, and the increase in polarization will reduce the performance of the battery unit.

Therefore, setting the preset differential result to an appropriate value, such as but not limited to 0.02, may avoid excessive overpotential, thereby avoiding excessive polarization of the battery unit, and preventing the performance of the battery unit from degrading. As such, on basis of avoiding influence on the performance of battery unit, it is possible to screen out battery units with better consistency and better performance, so that the final assembled battery device has excellent performance.

In this way, the characteristic value may be determined based on the variation curve between the differential result of overpotential and time and time, as well as the preset differential result, so as to facilitate the subsequent screening of battery units, so that the screened battery units have better consistency.

It should also be emphasized that, in the embodiment of the present disclosure, the characteristic value is substantially the time determined based on the variation curve between the differential result of overpotential and time and time, and the said time is the time when the overpotential has a feature change rate when the discharge process of the battery unit is controlled by a diffusion step (which may be interpreted as: the influence of concentration polarization, electrochemical polarization and ohmic polarization).

Moreover, during the design of battery units, the inconsistency of design parameters (including but not limited to the ratio of positive electrode design capacity to negative electrode design capacity, areal density, compaction degree, porosity, wettability, etc.), process defects (including but not limited to scratches, foreign substance and so on) and other factors will all affect the concentration polarization, which in turn affects the time when the overpotential has feature change rate.

Therefore, determining the characteristic value based on the time when the overpotential has feature change rate may effectively reflect the characteristics of the battery unit itself. Then the consistency of each battery unit may be evaluated based on the properties of the battery unit itself, and the battery units may be screened accordingly. Therefore, the consistency of the screened battery units may be improved.

In some embodiments, the disclosure further includes the following.

The battery units with characteristic values fall within the second preset range are screened from the selected battery units.

The second preset range is determined according to a found characteristic value range, and the found characteristic value range corresponding to the target charge state is found in a correspondence relationship between the preset charge state, the maximum discharge rate and characteristic value range.

That is to say, when screening battery units, on basis of performing screening according to the difference between the characteristic values, further screening is carried out according to whether the characteristic values fall within the second preset range, so as to realize double screening. As such, it may be ensured that the screened battery units have better performance and improved consistency.

In some embodiments, the target discharge rate may be determined according to the maximum discharge rate corresponding to the target charge state found in the correspondence relationship.

Specifically, the correspondence relationship between the target charge state, the maximum discharge rate and the characteristic value range may be shown in Table 1.

TABLE 1

| Target charge state | Maximum discharge rate | Characteristic value range |
|---|---|---|
| 10% | $I_1$ | $[T_1, T_2]$ |
| 20% | $I_2$ | $[T_3, T_4]$ |
| 30% | $I_3$ | $[T_5, T_6]$ |
| ... | ... | ... |
| 100% | $I_n$ | $[T_m, T_{m+1}]$ |

Based on Table 1, it may be determined that:

Each target charge state may correspond to a maximum discharge rate, and each target charge state may correspond to a characteristic value range, so that the target charge state, the maximum discharge rate and the characteristic value range are in a one-to-one correspondence relationship.

In this way, when the target charge state is determined, the corresponding maximum discharge rate may be found in Table 1, and then the found maximum discharge rate may be used as the target discharge rate, so that the battery units in the target charge state may be discharged according to the corresponding target discharge rate. As such, the characteristic value of the battery unit in the target charge state may be determined, making it convenient to screen the battery units.

To be specific about one thing, the second preset range may be the characteristic value range corresponding to the target charge state in Table 1. Therefore, if the characteristic value of the battery unit in the target charge state falls within the second preset range, it means that the characteristic value of the battery unit in the target charge state falls within a corresponding characteristic value range, which further indicates that the performance of the battery unit is better, thereby ensuring that the assembled battery device has improved performance.

In some embodiments, the method for determining the correspondence relationship specifically includes the following.

The maximum discharge rate corresponding to the target charge state is determined according to the overpotential obtained when the sample battery unit is discharged in any target charge state at different discharge rates.

When there are a plurality of sample battery units, and each sample battery unit is discharged according to the maximum discharge rate in the current charge state, and the overpotential corresponding to each sample battery unit is obtained, the characteristic value of each sample battery unit is determined according to the overpotential corresponding to each sample battery unit.

The mean and variance of each characteristic value are calculated respectively, and each the characteristic value range corresponding to the target charge state is determined according to the calculated mean and variance.

The correspondence relationship between the target charge state, the maximum discharge rate and the characteristic value range is established.

In the same target charge state, the maximum discharge rates of different sample battery units may be the same, the characteristic values of different sample battery units may be different, and the characteristic value ranges of different sample battery units may be the same.

In addition, when the sample battery unit is discharged, whether the discharge ends or not may be controlled according to the preset discharge time. That is, timing may be started when the sample battery unit begins to be discharged. When the preset discharge time is ended, the discharge of the sample battery unit cell may be controlled to end. The preset discharge time may be, but not limited to, 30 s, 40 s, 50 s, or 60 s, etc., which may be set according to actual needs, which is not limited in the disclosure.

In this way, through the above method, the correspondence relationship between the target charge state, the maximum discharge rate and the characteristic value range may be established, so that the target discharge rate corresponding to the target charge state may be determined, and in further screening, the second preset range corresponding to the target charge state may be determined, so as to realize the screening of battery units.

The following example illustrates the process of determining the correspondence relationship.

For example, taking tjat the target charge state is 50% and the preset discharge time is 40 s as an example, M (M is an integer greater than 1) sample battery units are prepared first, and it is ensured that the target charge state of each sample battery unit is 50%. In the meantime, the maximum discharge rate has no relevance with any specific sample battery unit, but is related to the target charge state, that is, the maximum discharge rate is determined by the target charge state. Therefore, when it is determined that the maximum discharge rate is $I_a$ when the target charge state is 50%, each sample battery unit may be controlled to discharge at a maximum discharge rate of $I_a$, and the discharge time may be controlled to 40 s.

Under the circumstances, M overpotentials may be obtained, and then M characteristic values may be determined based on the M overpotentials. If the mean value of the calculated M characteristic values is represented by a and the variance is represented by b, the characteristic value range corresponding to the target charge state 50% may be [a−xb, a+xb], and x may be set to 1, 2, 3 or a larger value; x may be set according to actual needs, which is not limited in the disclosure.

Therefore, the correspondence relationship between the target charge state 50%, the maximum discharge rate $I_a$, and the characteristic value range [a−xb, a+xb] may be established. The method of determining the correspondence relationship in the remaining target charge states is the same as above, and will not be repeated in detail here.

It should be noted that, due to differences in the overpotentials obtained from discharging of different sample battery units, the characteristic values of different sample battery units will be different.

Of course, in some embodiments, in addition to determining the characteristic value range based on the above method, the characteristic value range may also be determined based on the following method.

The range [a−w, a+w] is set as the preset range, and a represents the mean value, and w represents the allowable error that is determined empirically.

That is to say, in specific implementation, a method for determining the preset range may be selected according to actual needs, so as to meet the needs of different application scenarios and improve the flexibility of design.

In some embodiments, the step of determining the maximum discharge rate corresponding to the target charge state according to the overpotential obtained when the sample battery unit is discharged in any target charge state at different discharge rates specifically includes the following.

According to the preset sequence of multiple discharge rates from small to large, the sample battery units are controlled to discharge in sequence in any target charge state at various discharge rates, and the corresponding variation curves between differential results of overpotential and time and time are obtained in sequence.

The discharge rate corresponding to the variation curve with abrupt change at the end is determined as the maximum discharge rate corresponding to the target charge state.

The abrupt change of the variation curve shown at the end may be understood as follows.

Figure 3:
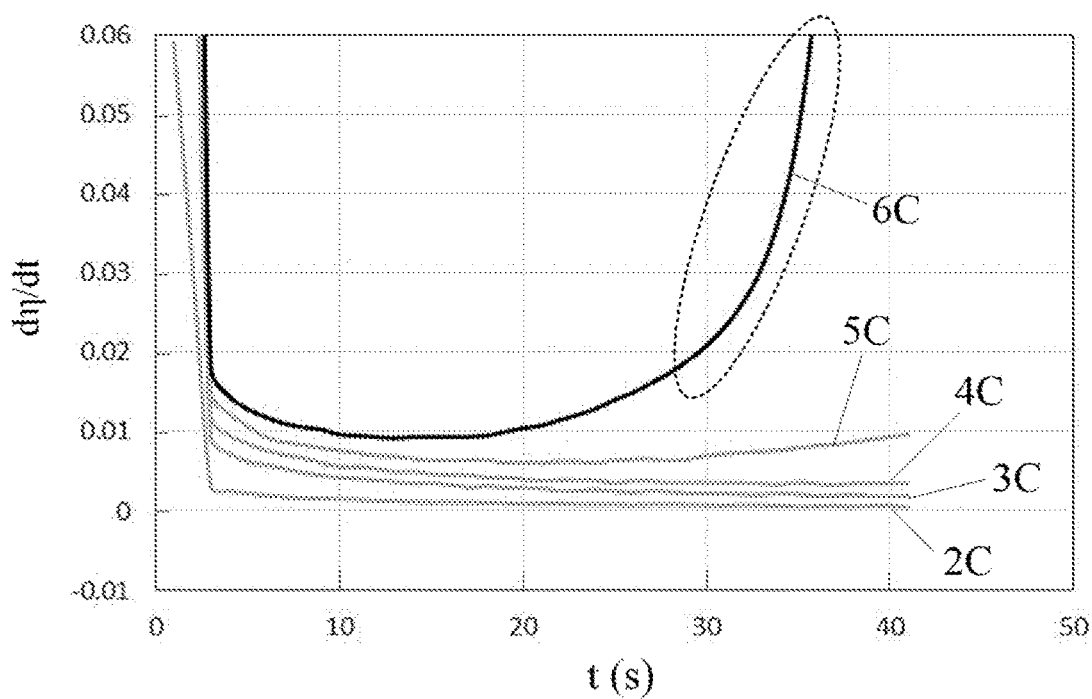
FIG. 3 is a schematic view of another variation curve provided in an embodiment of the present disclosure.

With reference to FIG. 3, 5 curves are shown in the figure, and each curve corresponds to one discharge rate. Among them, 2C, 3C, 4C, 5C and 6C respectively represent the discharge rate, and the curve corresponding to 2C is denoted as curve 1, the curve corresponding to 3C is denoted as curve 2, the curve corresponding to 4C is denoted as curve 3, the curve corresponding to 5C is denoted as curve 4, and the curve corresponding to 6C is denoted as curve 5.

The change tendencies of curve 1 to curve 4 are similar, and the curves are relatively flat after about 10 s, and there is no significant fluctuation and change.

The curve 5 starts to rise rapidly from about 20 s, showing a change tendency completely different from curve 1 to curve 4. Especially, the slope at the end of curve 5 (shown by the circle illustrated in dotted line in FIG. 3) is very large. Under the circumstances, it may be interpreted that the end of curve 5 is abruptly changed, while the ends of curve 1 to curve 4 are not abruptly changed.

Specifically, the process of determining the maximum discharge rate in any target charge state may specifically include the following.

Step S1: When the preset multiple discharge rates are sorted from small to large to obtain a discharge rate collection, the sample battery unit is controlled to discharge at the minimum discharge rate in the discharge rate collection in any target charge state, thereby obtaining the corresponding variation curve between the differential result of overpotential and time and time.

For example, with reference to FIG. 3, 2C may be regarded as the minimum discharge rate, and the obtained variation curve may be as shown in FIG. 3.

When discharging is carried out, the discharge time may be controlled but not limited to 40 s.

Moreover, the preset multiple discharge rates may be set according to actual needs, such as but not limited to 2C, 3C, 4C, 5C and 6C shown in FIG. 3, which are not limited in the disclosure.

Step S2: It is determined whether there is an abrupt change at the end of the currently obtained variation curve; if yes, go to step S3; if not, go to step S4.

Step S3: The most recently adopted discharge rate is determined as the maximum discharge rate in the target charge state, and the process is ended.

Step S4: The sample battery unit is controlled to discharge at a discharge rate in the discharge rate collection that is larger than and adjacent to the recently adopted discharge rate in the target charge state, thereby obtaining the corresponding variation curve between the differential result of overpotential and time and time, return to step S2.

For example, as shown in FIG. 3, if the recently adopted discharge rate is 2C, the discharge rate in the discharge rate collection that is larger than and adjacent to the recently adopted discharge rate may be 3C.

Alternatively, for the process of determining the maximum discharge rate in any target charge state, the following process may also be adopted.

Figure 4:
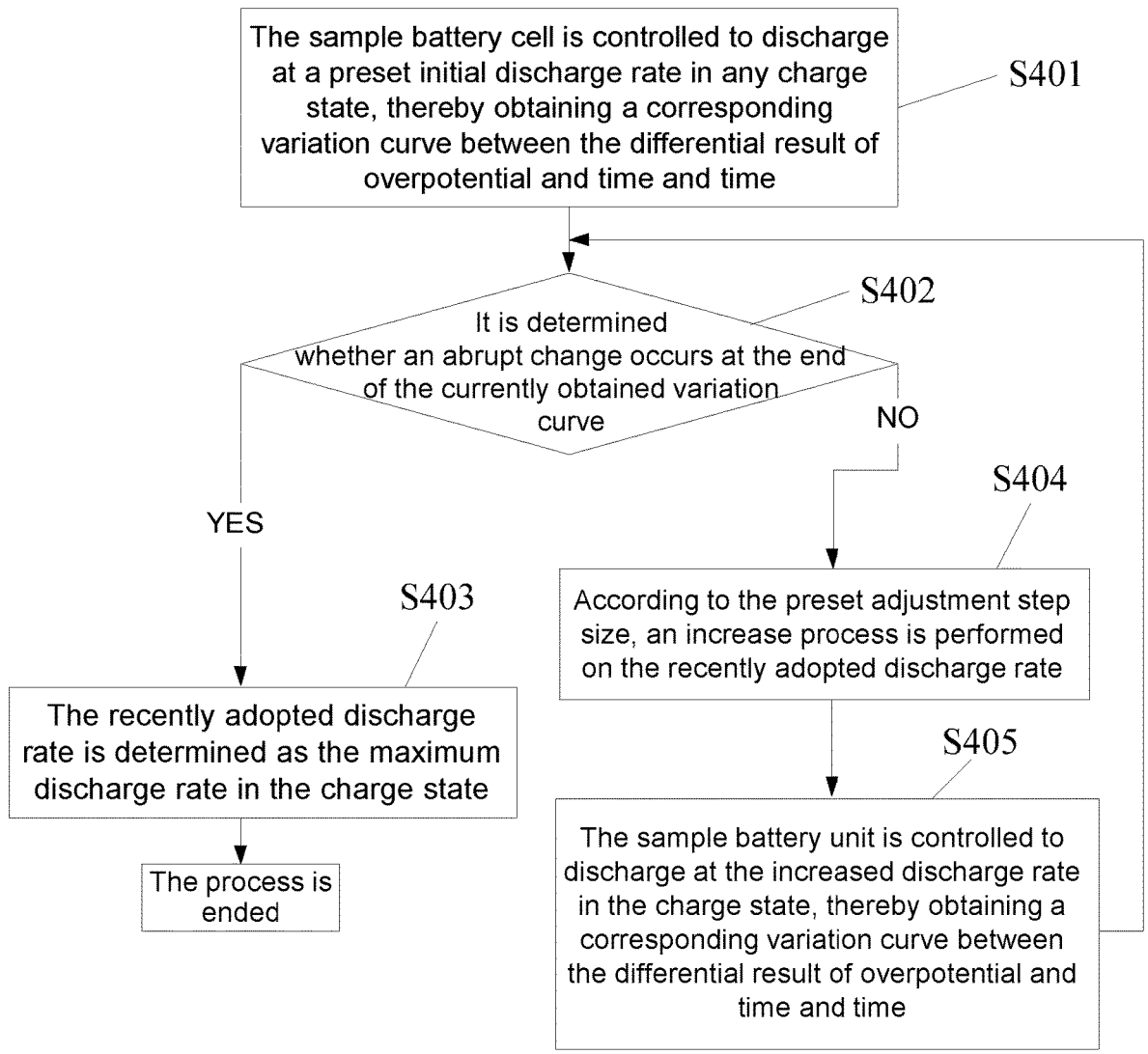
FIG. 4 is a flowchart of determining the maximum discharge rate in any charge state provided in an embodiment of the present disclosure.

Please refer to FIG. 4.

S401: The sample battery unit is controlled to discharge at a preset initial discharge rate in any target charge state, thereby obtaining a corresponding variation curve between the differential result of overpotential and time and time.

S402: It is determined whether an abrupt change occurs at the end of the currently obtained variation curve; if so, go to S403; if not, go to S404.

S403: The recently adopted discharge rate is determined as the maximum discharge rate in the target charge state, and the process is ended.

S404: According to the preset adjustment step size, an increase process is performed on the recently adopted discharge rate.

S405: The sample battery unit is controlled to discharge at the increased discharge rate in the target charge state, thereby obtaining a corresponding variation curve between the differential result of overpotential and time and time; go back to S402.

The preset adjustment step size may be, but is not limited to, 1C; if the recently adopted discharge rate is 3C, then the increased discharge rate is 4C.

In this way, the maximum discharge rate in any target charge state may be determined through the above method, and the correspondence relationship between the target charge state, the maximum discharge rate and the characteristic value range may be easily established to realize the screening of battery units.

An example is given below.

I. The soft-packed battery (i.e., the sample battery unit) with the target charge state of 50% is taken as an example.

1. The maximum discharge rate corresponding to the target charge state 50% is determined.

When the target charge state is 50%, the discharge rate adopted in sequence is 2C, 3C, 4C, 5C and 6C, and the sample battery unit is discharged for 40 s, and 5 corresponding variation curves are obtained, as shown in FIG. 3.

In FIG. 3, there is an abrupt change at the end of the curve 5, and under the circumstances, 6C may be determined as the maximum discharge rate corresponding to the target charge state 50%.

2. The characteristic value range corresponding to the target charge state 50% is determined.

15 (of course not limited to 15, 15 are only used as an example here) sample battery units are selected, and the target charge state of each sample battery unit is 50%. The adopted discharge rate is 6C. When the 15 sample battery units are discharged for 40 s respectively, 15 corresponding variation curves may be obtained, as the curves in the circle illustrated by dotted lines shown in FIG. 5.

Figure 5:
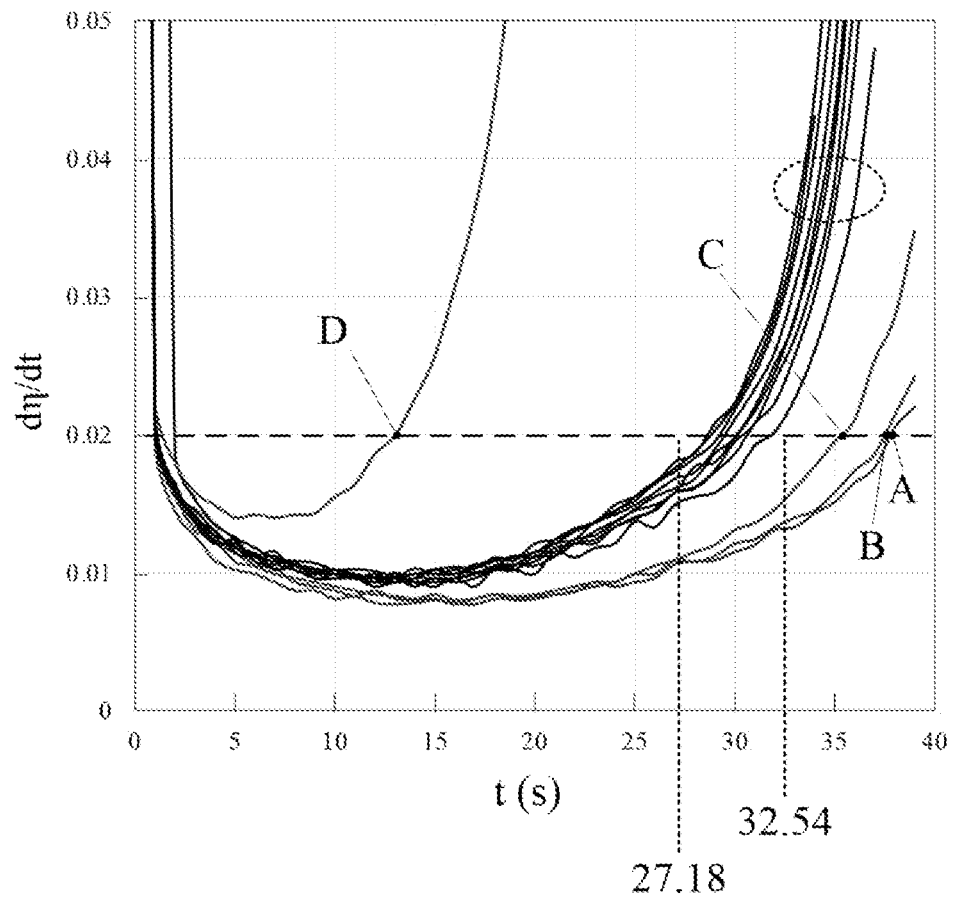
FIG. 5 is a schematic view of still another variation curve provided in an embodiment of the present disclosure.

When the preset differential result is 0.02 (as shown by the dashed line in FIG. 5), and the characteristic value range is [a−3b, a+3b], the characteristic value range may be determined according to the horizontal coordinate of the intersection point between the 15 variation curves and the dashed line in FIG. 5, and the determined characteristic value range may be [27.18 s, 32.54 s], as shown in FIG. 5.

3. The battery units with positive implant process defects is screened.

Defective battery unit (denoted as battery A): the type of defect is a 2 mm scratch on the bottom of the positive electrode, and the determined characteristic value (denoted as Ta) is 38.2 s (as shown by point A in FIG. 5).

Defective battery unit (denoted as battery B): the type of defect is a metal foreign substance with a size of 50 μm and a weight of 0.1 mg, and the determined characteristic value (denoted as Tb) is 37.76 s (as shown by point B in FIG. 5).

Defective battery unit (denoted as battery C): the type of defect is a 2 mm scratch in the middle of the negative electrode, and the determined characteristic value (denoted as Tc) is 35.37 s (as shown by point C in FIG. 5).

Defective battery unit (denoted as battery D): the type of defect is the shift of the pole piece, and the determined characteristic value (denoted as Td) is 13.03 s (as shown by point D in FIG. 5).

The following may be obtained by calculation.

The relative difference between the determined characteristic values Ta and Tb is 1.15%, which is calculated by (38.2−37.76)/38.2.

The relative difference between the determined characteristic values Ta and Tc is 7.41%, which is calculated by (38.2−35.37)/38.2

The relative difference between the determined characteristic values Ta and Td is 65.89%, which is calculated by (38.2−13.03)/38.2.

When the first preset range is set to 0.5% to 10%, since the relative difference between the determined characteristic values Ta and Td is not within the first preset range, and the relative difference between the determined characteristic values Ta and Tb and the relative difference between the determined characteristic values Ta and Tc are within the first preset range, the battery D may be removed first to determine that the consistency of the battery D is poor.

Since the relative difference between the determined characteristic values Tb and Tc is 6.33%, which is calculated by (37.76−35.37)/37.76, and a value of 6.33% is within the first preset range, the battery A, the battery B, and the battery C may be retained temporarily.

Further, since the determined characteristic values Ta, Tb and Tc are not within a range of [27.18 s, 32.54 s], it may be further determined that the consistency of the battery A, the battery B and the battery C are all poor, and they are all removed.

II. The square casing battery units with a target charge state of 30% is taken as an example.

1. The maximum discharge rate corresponding to the target charge state of 30% is determined.

When the target charge state is 30%, the discharge rate adopted in sequence is 2C, 3C, 4C and 5C, and the battery is discharged for 40 s, and 4 corresponding variation curves are obtained.

Among the variation curves, only an abrupt change occurs at the end of the variation curve for the discharge rate of 5C. Under the circumstances, 5C may be determined as the maximum discharge rate corresponding to the target charge state 30%.

2. The characteristic value range corresponding to the target charge state 30% is determined.

15 (of course not limited to 15, 15 are only used as an example here) sample battery units are selected, and the target charge state of each sample battery unit is 30%. The adopted discharge rate is 5C. When the 15 sample battery units are discharged for 40 s respectively, 15 corresponding variation curves may be obtained, as the curves in the circle illustrated by dotted lines shown in FIG. 6.

Figure 6:
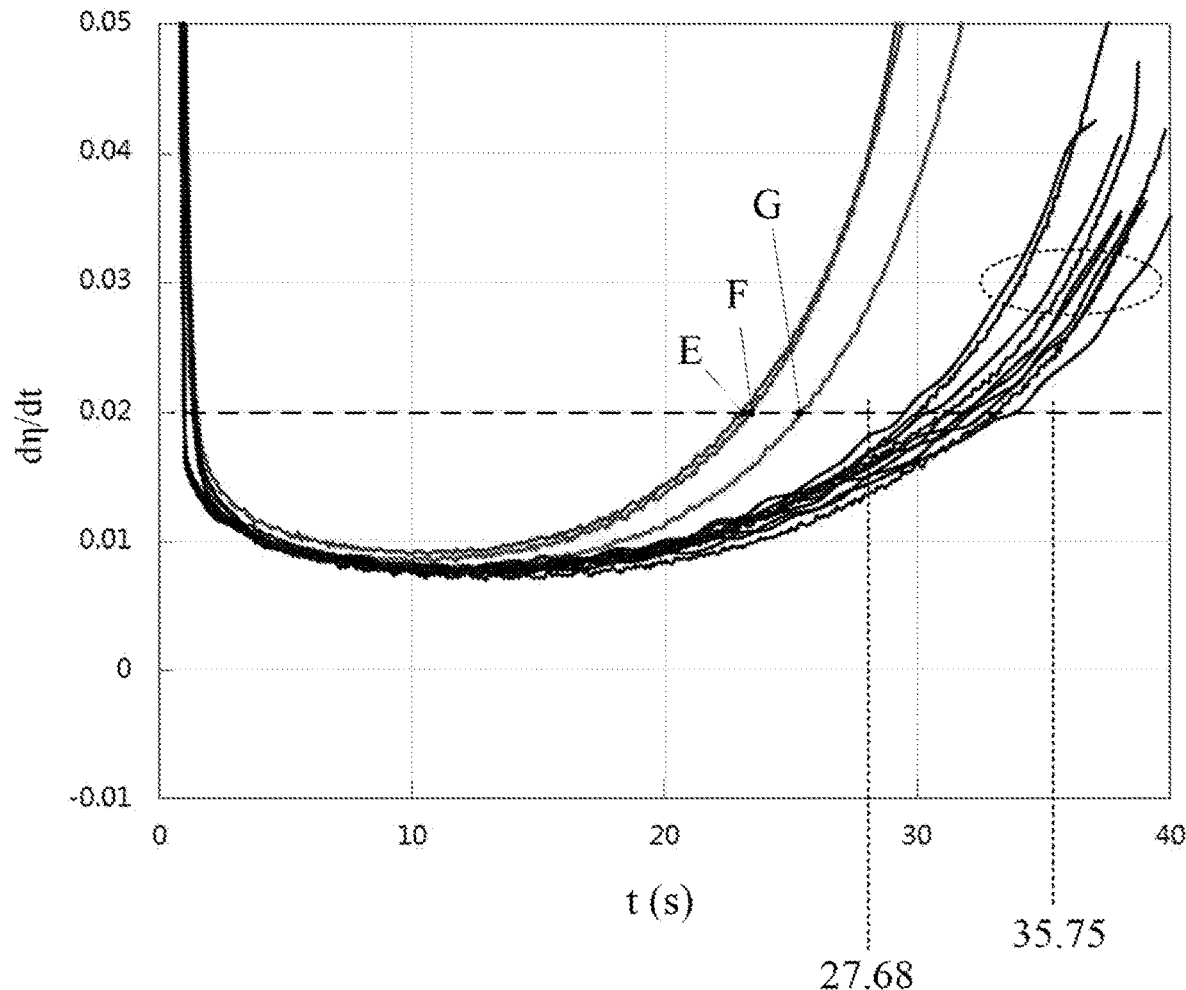
FIG. 6 is a schematic view of yet another variation curve provided in an embodiment of the present disclosure.

When the preset differential result is 0.02 (as shown by the dashed line in FIG. 5), and the characteristic value range is [a−3b, a+3b], the characteristic value range may be determined according to the horizontal coordinate of the intersection point between the 15 variation curves and the dashed line in FIG. 6, and the determined characteristic value range may be [27.68 s, 35.75 s], as shown in FIG. 6.

3. The battery units with positive implantation deviation is screened.

Deviation battery unit (denoted as battery E): characteristic value (denoted as Te) is 23.12 s (as shown by point E in FIG. 6).

Deviation battery unit (denoted as battery F): characteristic value (denoted as Tf) is 23.44 s (as shown by point F in FIG. 6).

Deviation battery unit (denoted as battery G): characteristic value (denoted as Tg) is 25.45 s (as shown by point G in FIG. 6).

Specifically, the reason for the deviation may be the diaphragm closed pores at different levels.

The following may be obtained by calculation.

The relative difference between the determined characteristic values Tf and Te is 1.37%, which is calculated by (23.44−23.12)/23.44.

The relative difference between the determined characteristic values Tg and Te is 9.16%, which is calculated by (25.45−23.12)/25.45.

The relative difference between the determined characteristic values Tg and Tf is 7.90%, which is calculated by (25.45−23.44)/25.45.

When the first preset range is set to 0.5% to 10%, since the relative difference between the determined characteristic values Tf and Te, the relative difference between the determined characteristic values Tg and Tf, and the relative difference between the determined characteristic values Tg and Te are all within the first preset range, the battery E, the battery F, and the battery G may be temporarily retained.

Further, since the determined characteristic values Te, Tf and Tg are not within a range of [27.68 s, 35.75 s], it may be further determined that the consistency of the battery E, the battery F and the battery G are all poor, and they are all removed.

3. The battery device of a specific system will be described as an example.

In order to better reflect the performance of the battery device assembled by the battery units screened based on the characteristic values, the battery device of a ternary system is selected for illustration. The specific results may be seen in Table 2.

In Table 2, 4 #is a comparative example, a represents the mean value mentioned in the above content, b represents the variance mentioned in the above content, and k represents the maximum value of the relative difference between the characteristic values of any two battery units under the target charge state when the battery device includes multiple (that is, two or more) battery units. The number of turns indicates the number of times the battery unit is cycled when the battery health state of the battery unit decays from 100% to 80%.

TABLE 2

| Serial number of examples | 1# | 2# | 3# | 4# |
|---|---|---|---|---|
| Multiple of variance | 0.2b | 2b | 3b | 6b |
| a − 3b | 31.441 | 29.02 | 27.675 | 23.64 |
| a + 3b | 31.979 | 34.40 | 35.745 | 39.78 |
| a | 0.54 | 5.38 | 8.07 | 16.14 |
| k | 2% | 17% | 25% | 51% |
| Number of turns | 1842 | 1665 | 1507 | 834 |

From Table 2 the following conclusions may be drawn.

First, it may be determined from Example 1 #, Example 2 # and Example 3 # that with the increase of k, the number of turns gradually decreases. That is, with the increase of the maximum value in the relative difference of the characteristic values of any two battery units at the target charge state, the number of cycles is gradually reduced when the battery device reaches the target state (that is, the state when the battery health state of the battery unit decays from 100% to 80%). Moreover, the smaller the value k, the better the consistency, which in turn means the better the consistency. The more times the battery device is cycled when it reaches the target state, the more stable the performance of the battery device and the longer the service life.

Second, from Example 1 # and Comparative Example 4 #, it may be determined that the k of Comparative Example 4 # is significantly larger than that of Example 1 #. Correspondingly, when the battery device of Comparative Example 4 # reaches the target state, the number of cycles is correspondingly much less, which also confirms that the better the consistency, the more stable the performance of the battery device, and the longer the service life, while the worse the consistency, the more unstable the performance of the battery device, the faster the decay speed, and the shorter the service life.

Figure 7:
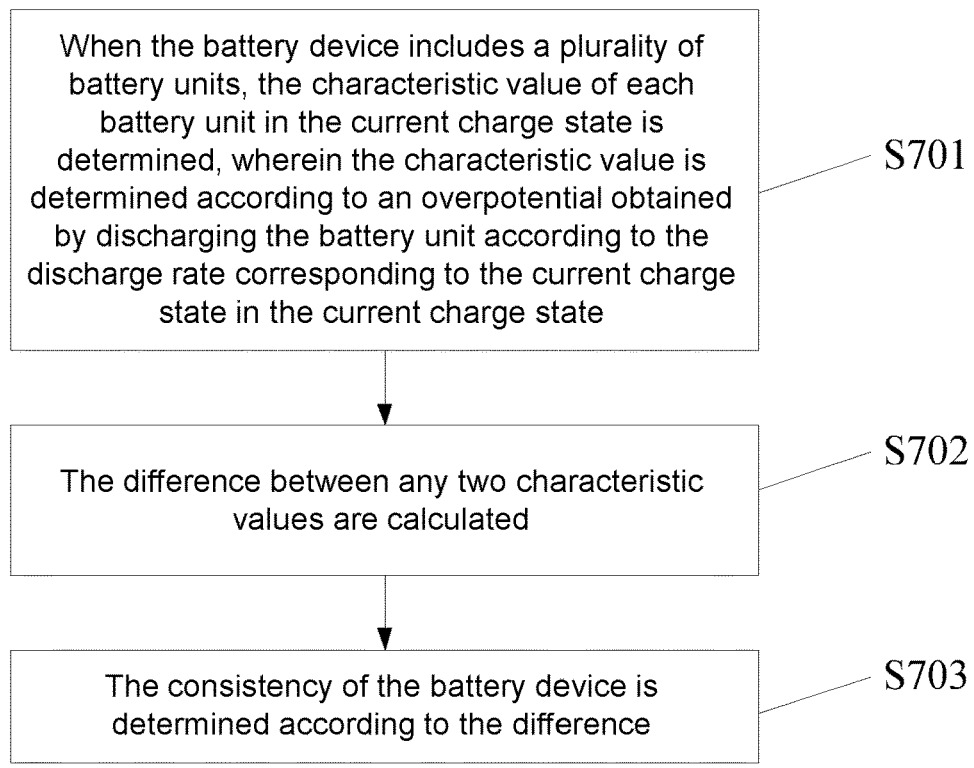
FIG. 7 is a flowchart of a detection method of a battery device provided in an embodiment of the present disclosure.

Based on the same inventive concept, an embodiment of the present disclosure provides a detection method for a battery device, as shown in FIG. 7, including the following.

S701. When the battery device includes a plurality of battery units, the characteristic value of each battery unit in the current charge state is determined. The characteristic value is determined according to an overpotential obtained by discharging the battery unit according to the discharge rate corresponding to the current charge state in the current charge state.

The specific process of determining the characteristic value of each battery unit may be derived from the above content, which will not be described in detail here.

S702. The difference between any two characteristic values are calculated.

S703. The consistency of the battery device is determined according to the difference between any two characteristic values.

In this way, the solution may dynamically monitor the consistency of each battery unit in the battery device, which may reflect the consistency of the battery unit during use, realize the online monitoring of the battery unit, and provide guidance for use of the battery device in subsequent process.

In addition, the detection method takes a short time, and the test cost is low, so that low-cost, fast and effective detection may be realized.

In some embodiments, the step of determining the consistency of the battery device according to the difference between any two characteristic values specifically includes the following.

The maximum value among all the differences between any two characteristic values is determined.

According to the correspondence relationship between the preset difference range and the consistency level, the consistency level corresponding to the difference range where the maximum value falls within is determined.

For example, the correspondence relationship between the difference range and the consistency level may be as shown in Table 3.

TABLE 3

| Difference range | Consistency level |
|---|---|
| [c1-c2] | Good |
| [c2-c3] | Medium |
| [c3-c4] | Poor |

Assuming that the difference range where the determined maximum value falls within is [c2-c3], it means that the consistency level of the battery device is medium, indicating that the performance and service life of the battery device are normal.

Assuming that the difference range where the determined maximum value falls within is [c1-c2], it means that the consistency level of the battery device is excellent, indicating that the performance and service life of the battery device are good.

Assuming that the difference range where the determined maximum value falls within is [c3-c4], it means that the consistency level of the battery device is poor, indicating that the performance and service life of the battery device are both poor.

Of course, the correspondence relationship between the difference range and the consistency level is not limited to that shown in Table 3. Here. Table 3 is used as an example for description. In actual situations, the correspondence relationship between the difference range and the consistency level may be preset according to actual needs, the disclosure is not limited thereto.

In this way, the consistency of the battery device may be determined based on the maximum value among all the differences between any two characteristic values and the correspondence relationship between the difference range and the consistency level, so as to provide a reference for the use of the battery device.

Of course, in some embodiments, in addition to determining the consistency of the battery device according to the maximum value of all the differences between any two characteristic values, the disclosure may further include the following.

The mean value of all differences between any two characteristic values is calculated, and the consistency level corresponding to the difference range where the mean falls within is determined.

In this way, the differences between any two characteristic values between all battery units may be reflected, and the consistency of the battery device may be evaluated from a comprehensive perspective.

In some embodiments, the disclosure further includes the following.

The maximum value among all the difference between any two characteristic values s is determined.

According to the correspondence relationship between the preset difference range and the precaution level, the precaution level corresponding to the difference range where the maximum value falls within is determined.

For example, the correspondence relationship between the difference range and the precaution level may be shown in Table 4.

TABLE 4

| Difference range | Precaution level |
|---|---|
| [c5-c6) | Level 1 |
| [c7-c8) | Level 2 |
| [c9-c10) | Level 3 |

Assuming that the difference range where the determined maximum value falls within is [c7-c8), it means that the precaution level of the battery device is the second level. If the first level represents the lowest level and the third level represents the highest level, it may be determined that the current battery device has a relatively serious safety issue, but the degree of safety issue is neither high nor low, and the issue needs attending to. If the battery device continues to be used, the possibility of danger is very high.

Assuming that the difference range where the determined maximum value falls within is [c5-c6), it means that the precaution level of the battery device is the first level, and it may be determined that the current battery device has certain safety issues, but the level of safety issue is low. The user of the battery device is reminded to pay attention to the usage of the battery device at any time.

Assuming that the difference range where the determined maximum value falls within is [c9-c10), it means that the precaution level of the battery device is the third level, and it may be determined that the current battery device has a very serious safety issue and it is necessary to stop using the battery device immediately.

Of course, the correspondence relationship between the difference range and the precaution level is not limited to that shown in Table 4. Here. Table 4 is used as an example for description. In actual situations, the correspondence relationship between the difference range and the precaution level may be preset according to actual needs, which is not limited in the disclosure.

In this way, the precaution level of the battery device may be determined, which provides a reference for the subsequent use and maintenance of the battery device and avoids the occurrence of danger.

Of course, in some embodiments, in addition to determining the precaution level of the battery device according to the maximum value among all the differences between any two characteristic values, the method may further include the following.

The mean of all the differences between any two characteristic values is calculated, and the precaution level corresponding to the difference range of the said mean falls within is determined.

In this way, the differences of all battery units may be reflected, and the precaution level of the battery device may be evaluated from a comprehensive perspective.

In some embodiments, the battery device is a battery pack, and the battery units are battery modules or battery groups.

Or, when the battery device is a battery set or a battery module, the battery unit is a battery.

Or, when the battery device is a containerized battery system, the battery unit is a battery pack.

In this way, the detection method may evaluate the consistency differences between the containerized battery system, the battery pack, and the battery module (or battery set) in three different levels, and has a wide range of application fields and high practicability.

In some embodiments, precaution, display, and recording may also be performed based on the determined consistency of the battery device to provide data reference for subsequent improvement and analysis of battery performance, and to provide users with more intuitive data, allowing users to pay attention to the performance changes of the battery device, and prepare for the occurrence of danger in advance, so as to improve the safety of the battery device during use.

Based on the same inventive concept, an embodiment of the present disclosure provides a screening device for battery units. The implementation principle of the screening device is similar to that of the aforementioned screening method. For specific embodiments of the screening device, please refer to the specific implementation of the aforementioned screening method, and the details will not be repeated.

Figure 8:
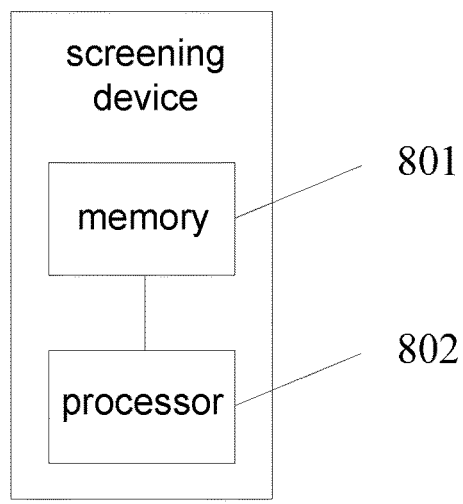
FIG. 8 is a schematic structural view of a screening device for battery units provided in an embodiment of the present disclosure.

Specifically, a screening device for battery units provided by an embodiment of the present disclosure is as shown in FIG. 8, including the following.

A memory 801 is configured for storing program instructions.

A processor 802 is configured to invoke the program instructions stored in the memory 801, and execute the above-mentioned screening method provided by the embodiment of the present disclosure according to the obtained program.

Based on the same inventive concept, an embodiment of the present disclosure provides a detection device for a battery device. The implementation principle of the detection device is similar to the implementation principle of the foregoing detection method. For specific embodiments of the detection device, please refer to the specific implementation of the foregoing detection method, and the details will not be repeated.

Figure 9:
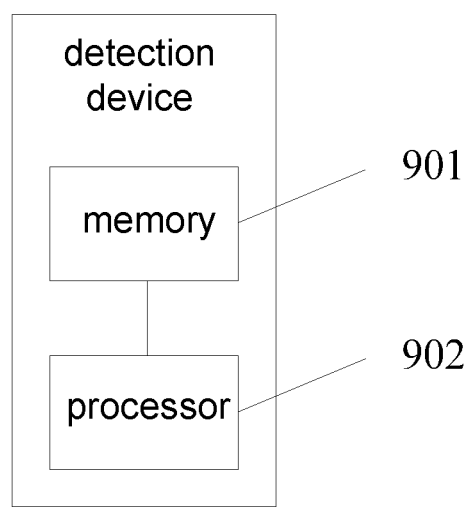
FIG. 9 is a schematic structural view of a detection device for a battery device provided in an embodiment of the present disclosure.

Specifically, a detection device for a battery device provided by an embodiment of the present disclosure is as shown in FIG. 9, including the following.

A memory 901 is configured for storing program instructions.

A processor 902 is configured to invoke the program instructions stored in the memory 901, and execute the foregoing detection method provided by the embodiment of the present disclosure according to the obtained program.

In some embodiments, the detection device may be a module in the battery management system, and the module may be an existing module in the battery management system, or may be a newly added module in the battery management system, as long as the detection function can be integrated into the battery management system.

It will be apparent to those skilled in the art that various modifications and variations can be made in the present disclosure without departing from the spirit and scope of the disclosure. Thus, provided that these modifications and variations of the present disclosure fall within the scope of the claims of the present disclosure and their equivalents, the present disclosure is also intended to include these modifications and variations.

What is claimed is:

1. A battery device, comprising at least two battery units, wherein a relative difference between characteristic values of any one of the at least two battery units under a target charge state is within a first preset range;
    wherein the first preset range is 0.5% to 10%, and the relative difference is a ratio of a difference between two of the characteristic values to a larger value of two of the characteristic values;
    the characteristic values are obtained through testing as follows:

any one of the at least two battery units at 3.6 Volt (V) is discharged at a discharge rate of 6 Capacity (C) for 40 second(s), and a variation curve between a differential result of an overpotential and a time and the time is obtained, and a target point corresponding to the differential result with a value of 0.02 is selected from the variation curve, when the target point comprises two target points, the characteristic values are determined according to a maximum value of the time corresponding to each of the two target points, wherein one of the characteristic values of any one of the at least two battery units under the target charge state is within a second preset range;

wherein the second preset range is 27 s to 36 s.

2. The battery device according to claim 1, wherein the first preset range is set to 2% to 5%.

3. The battery device according to claim 1, wherein a material for manufacturing a casing of the at least two battery units comprises non-metal, and the second preset range is 27 s to 33 s; or the material for manufacturing the casing of the at least two battery units comprises metal, and the second preset range is 27 s to 36 s.

4. A screening method of a battery unit, comprising:

for a plurality of battery units to be selected, determining a characteristic value of each of the plurality of battery units in a target charge state; wherein the characteristic value is determined according to an overpotential obtained by discharging each of the plurality of battery units according to a target discharge rate corresponding to the target charge state in the target charge state;

calculating a difference between any two of the characteristic values; and selecting the battery unit with the difference between any two of the characteristic values falls within a first preset range, wherein one of the characteristic values of any one of the at least two battery units under the target charge state is within a second preset range;

wherein the second preset range is 27 s to 36 s.

5. The screening method according to claim 4, wherein the step of determining the characteristic value of each of the plurality of battery units in the target charge state according to the overpotential comprises the following:

when the battery unit in the target charge state is discharged according to the target discharge rate, obtaining a variation curve between a differential result of the overpotential and the time and the time; and according to preset selection requirements, selecting a target point from the variation curve, and determining the characteristic value according to the target point.

6. The screening method according to claim 5, wherein the step of, according to the preset selection requirements, selecting the target point from the variation curve and determining the characteristic value according to the target point comprises the following:

determining a point corresponding to a preset differential result in the variation curve as the target point; and when the target point comprises one target point, adopting a time corresponding to the target point as the characteristic value; or, when the target point comprises a plurality of target points, adopting a maximum value of the time corresponding to each of the plurality of target points as the characteristic value.

7. The screening method according to claim 5, further comprising:

screening the plurality of battery units, from the selected plurality of battery units, for which the characteristic values fall within the second preset range, wherein the second preset range is determined according to a found characteristic value range, and the found characteristic value range corresponding to the target charge state is found in a correspondence relationship between a preset charge state, a maximum discharge rate and a characteristic value range.

8. A screening device for battery units, comprising:

a memory, configured for storing program instructions; and a processor, configured to invoke the program instructions stored in the memory, and execute the screening method according to claim 5 according to an obtained program.

9. The screening method according to claim 4, further comprising:

screening the plurality of battery units, from the selected plurality of battery units, for which the characteristic values fall within the second preset range, wherein the second preset range is determined according to a found characteristic value range, and the found characteristic value range corresponding to the target charge state is found in a correspondence relationship between a preset charge state, a maximum discharge rate and a characteristic value range.

10. The screening method according to claim 9, wherein the target discharge rate is determined according to the maximum discharge rate corresponding to the target charge state found in the correspondence relationship.

11. The screening method according to claim 9, wherein the method for determining the correspondence relationship comprises the following:

determining the maximum discharge rate corresponding to the target charge state according to the overpotential obtained when a sample battery unit is discharged in any of target charge states at different discharge rates;

when the sample battery unit comprises a plurality of sample battery units, and each of the plurality of sample battery units is discharged according to the maximum discharge rate in the target charge state, and an overpotential corresponding to each of the plurality of sample battery units is obtained, determining a characteristic value of each of the plurality of sample battery units according to the overpotential corresponding to each of the plurality of sample battery units;

calculating a mean and a variance of the characteristic values respectively, and determining a characteristic value range corresponding to the target charge state according to the calculated mean and the calculated variance of the characteristic values; and establishing the correspondence relationship between the preset charge state, the maximum discharge rate and the characteristic value range.

12. The screening method according to claim 11, wherein the step of determining the maximum discharge rate corresponding to the target charge state according to the overpotential obtained when the sample battery unit is discharged in any of the target charge states at the different discharge rates comprises the following:

according to a preset sequence of the different discharge rates from small to large, controlling the sample battery unit to discharge in sequence in any of the target charge states at the different discharge rates, and obtaining corresponding variation curves between the differential results of the overpotential and the time and the time in sequence; and determining each of the different discharge rates corresponding to the variation curve with an abrupt change at an end as the maximum discharge rate corresponding to the target charge state.

13. A screening device for battery units, comprising:
a memory, configured for storing program instructions; and
a processor, configured to invoke the program instructions stored in the memory, and execute the screening method according to claim 4 according to an obtained program.

14. A detection method of a battery device, comprising:
when the battery device comprises a plurality of battery units, determining a characteristic value of each of the plurality of battery units in a current charge state; wherein the characteristic value is determined according to an overpotential obtained by discharging each of the plurality of battery units according to a discharge rate corresponding to the current charge state in the current charge state;
calculating a difference between any two of the characteristic values, such that at least one of the plurality of battery units is screened according to the calculated difference; and
determining a consistency of the battery device according to the difference between any two of the characteristic values,
wherein one of the characteristic values of any one of the plurality of battery units under a target charge state is within a second preset range;
wherein the second preset range is 27 s to 36 s.

15. The detection method according to claim 14, wherein the step of determining the consistency of the battery device according to the difference between any two of the characteristic values comprises the following:

determining a maximum value among all the differences between any two of the characteristic values; and
according to a correspondence relationship between a preset difference range and a consistency level, determining the consistency level corresponding to a difference range where the maximum value falls within.

16. The detection method according to claim 15, further comprising:
determining a maximum value among all the differences between any two of the characteristic values; and
according to a correspondence relationship between the preset difference range and a precaution level, determining the precaution level corresponding to a difference range where the maximum value falls within.

17. A detection device for a battery device, comprising:
a memory, configured for storing program instructions; and
a processor, configured to invoke the program instructions stored in the memory, and execute the detection method according to claim 15 according to an obtained program.

18. The detection method according to claim 14, further comprising:
determining a maximum value among all the differences between any two of the characteristic values; and
according to a correspondence relationship between the preset difference range and a precaution level, determining the precaution level corresponding to a difference range where the maximum value falls within.

19. A detection device for a battery device, comprising:
a memory, configured for storing program instructions; and
a processor, configured to invoke the program instructions stored in the memory, and execute the detection method according to claim 14 according to an obtained program.

* * * * *